United States Patent [19]

Tada et al.

[11] 4,454,222
[45] Jun. 12, 1984

[54] PROCESS FOR FORMING RESIST PATTERNS USING MIXED KETONE DEVELOPERS

[75] Inventors: Tsukasa Tada, Yokohama; Akira Miura, Toride, both of Japan

[73] Assignee: Tokyo Shibaura Denki Kabushiki Kaisha, Kawasaki, Japan

[21] Appl. No.: 367,921

[22] Filed: Apr. 13, 1982

[30] Foreign Application Priority Data

Apr. 21, 1981 [JP] Japan .................................. 56-59217
Apr. 21, 1981 [JP] Japan .................................. 56-59218
Oct. 6, 1981 [JP] Japan .................................. 56-158205

[51] Int. Cl.$^3$ ........................ G03C 5/24; G03C 1/495
[52] U.S. Cl. .................................. 430/326; 430/331; 430/270
[58] Field of Search ................ 430/311, 326, 331, 270

[56] References Cited

U.S. PATENT DOCUMENTS

| 3,535,137 | 10/1970 | Haller et al. | 117/8 |
| 3,770,433 | 11/1973 | Bartelt et al. | 430/331 X |
| 3,984,582 | 10/1976 | Feder et al. | 430/270 X |
| 4,125,672 | 11/1978 | Kakuchi et al. | 428/421 |
| 4,259,407 | 3/1981 | Tada et al. | 428/421 |

FOREIGN PATENT DOCUMENTS 64222 10/1982 European Pat. Off. ............ 430/285
51-2430 1/1976 Japan .

OTHER PUBLICATIONS

Tsukasa Tada, "Poly(Trifluoroethyl β-Chloroacrylate) as a Highly Sensitive Positive Electron Resist," *Journal of the Electrochemical Society*, vol. 126, 1979, pp. 1829–1830.

IBM Technical Disclosure Bulletin, vol. 20, No. 5, Oct. 1977, European Search Report.

Primary Examiner—John E. Kittle
Assistant Examiner—Cynthia Hamilton
Attorney, Agent, or Firm—Schwartz, Jeffery, Schwaab, Mack, Blumenthal & Koch

[57] ABSTRACT

Disclosed is a process for forming resist patterns by coating on a substrate at least one selected from homopolymers of a monomer represented by the formula:

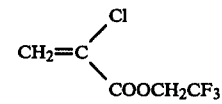

and copolymers of said monomer with other vinyl monomers, applying radiation to a desired portion thereof, and thereafter carrying out development treatment with use of a developer, which is characterized in that said developer is composed of one or more of ketones selected from the group consisting of 2-butanone, 2-methyl-3-butanone, 2-pentanone, 3-pentanone and 4-methyl-2-pentanone; or mixture thereof with other ketone and/or alcohol, except for a single use of 2-butanone and a combination of 4-methyl-2-pentanone and alcohol.

19 Claims, No Drawings

PROCESS FOR FORMING RESIST PATTERNS USING MIXED KETONE DEVELOPERS

This invention relates to a developer for a radiation-sensitive positive resist having high sensitivity, and more particularly to a process for forming a resist pattern characterized in that a developer according to this invention is applied to a halogen-containing radiation-sensitive positive resist having a particular structure, whereby a fine pattern having minimal defects can be formed in much shorter time than the conventional method.

Heretofore, as a fine processing technique for the production of semiconductor elements, megnetic valve elements or optical elements, there has been used a photolithography wherein an ultraviolet ray having a wave length of not less than 4000 Å is used. In recent years, however, with the development of highly compact and highly integrated semiconductor elements, an attention has been drawn to a technique for a lithography using electron beams, X-ray, etc., and radiation-sensitive resists having high sensitivity and high resolution to be used for a such technique have been developed. However, none of them have adequately satisfactory properties for practical applications, and they have certain drawbacks from a viewpoint of mass production.

It has been reported that a fluoroalkyl-α-chloroacrylate polymer such as poly(trifluoroethyl-α-chloroacrylate) is a highly sensitive radiation-sensitive positive resist (T. Tada, J. Electrochem. Soc., 126 1829 (1979)). This resist has drawbacks that especially when it is used in a low radiation region, it requires a long period of developing time, and the spray development process which brings about little defects caused by inclusion of impurities and which is suitable for mass production, is hardly applicable.

This invention has been accomplished under the above-mentioned circumstances. It is intended to provide a process for forming a resist pattern by applying a specific developer to a radiation-sensitive positive resist comprising poly(trifluoroethyl-α-chloroacrylate) or a copolymer of trifluoroethyl-α-chloroacrylate with other vinyl monomers, whereby a fine pattern can be formed in a much shorter period of time than the conventional method, and therefore provide a process in which the spray development treatment is feasible and which has minimal drawbacks and is quite suitable for mass production.

According to this invention, there is provided a process for forming resist patterns, which comprises coating on a substrate at least one selected from homopolymers of a monomer represented by the formula:

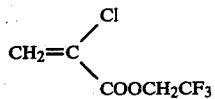

and copolymers of said monomer with other vinyl monomers, applying radiation to a desired portion thereof, and thereafter carrying out development treatment with use of a developer composed of one or more of ketones selected from the group consisting of 2-butanone, 2-methyl-3-butanone, 2-pentanone, 3-pentanone and 4-methyl-2-pentanone; or a mixture thereof with other ketone and/or alcohol, except for a single use of 2-butanone and a combination of 4-methyl-2-pentanone and alcohol.

In a case where a conventional developer, i.e. a solution of 2-propanol and 4-methyl-2-pentanone, for a highly sensitive radiation-sensitive positive resist, i.e. polytrifluoroethyl-α-chloroacrylate, was used and electron beams were radiated at a rate of from 2 to 5 $\mu C/cm^2$, a developing time of from 10 to 20 minutes was required. Whereas, according to this invention, it has been confirmed that, with use of the developer as defined above, the developing time has been shortened to a level of from 1 to 4 minutes, whereby the spray development process is applicable and a clear resist pattern is obtainable.

When 2-butanone is used alone as the developer, both of the electron beam-radiated portion and unradiated portion of the resist material are dissolved with a result of no formation of resist pattern.

The addition of the aforesaid other ketone or alcohol to the developer is preferable for the improvement of resolution. As said other ketones mentioned herein, there may be employed 2-heptanone, 2-hexanone, 3-hexanone, 2-methyl-5-hexanone, 3-methyl-5-hexanone, 4-methyl-5-hexanone, 3-methyl-2-butanone, 2-methyl-3-pentanone, 3-methyl-2-pentanone, etc.

As examples of radiation-sensitive positive resist to which the present invention is applied, there may be mentioned poly(trifluoroethyl-α-chloroacrylate), a trifluoroethyl-α-chloroacrylate/methylmethacrylate copolymer, a trifluoroethyl-α-chloroacrylate/t-butylmethacrylate copolymer, a trifluoroethyl-α-chloroacrylate/trifluoroisopropyl-α-chloroacrylate copolymer, a trifluoroethyl-α-chloroacrylate/phenyl-α-chloroacrylate copolymer, a trifluoroethyl-α-chloroacrylate/α-methylstyrene copolymer, a trifluoroethyl-α-chloroacrylate/benzyl-α-chloroacrylate copolymer, a trifluoroethyl-α-chloroacrylate/methacrylic acid copolymer etc.

The proportion of the trifluoroethyl-α-chloroacrylate in the above-mentioned copolymers should generally be not less than 50 mole % and preferably be not less than 60 mole %.

As specific examples of the developer system according to this invention, there may be mentioned (A) a 2-butanone/2-heptanone mixture, a 2-butanone/2-methyl-5-hexanone mixture, a 2-butanone/3-methyl-5-hexanone mixture, a 2-butanone/4-methyl-5-hexanone mixture, a 2-butanone/2-methyl-3-butanone mixture, a 2-butanone/2-methyl-3-butanone/2-propanol mixture, 2-methyl-3-butanone, a 2-butanone/2-propanol mixture, etc.; (B) a 2-pentanone/2-heptanone mixture, a 2-pentanone/2-methyl-5-hexanone mixture, 2-pentanone/3-methyl-5-hexanone mixture, 2-pentanone/4-methyl-5-hexanone mixture, a 2-pentanone/2-methyl-3-butanone mixture, a 2-pentanone/2-butanone/2-propanol mixture, a 3-pentanone/2-heptanone mixture, a 3-pentanone/3-heptanone mixture, a 3-pentanone/2-methyl-5-hexanone mixture, a 3-pentanone/3-methyl-5-hexanone mixture, a 3-pentanone/4-methyl-5-hexanone mixture, a 3-pentanone/2-methyl-3-butanone mixture, a 3-pentanone/2-butanone/2-propanol mixture, 2-pentanone, 3-pentanone, a 2-pentanone/3-pentanone mixture, a 2-pentanone/2-propanol mixture, a 3-pentanone/2-propanol mixture, etc., and (C) 4-methyl-2-pentanone, a 4-methyl-2-pentanone/2-butanone mixture, a 4-methyl-2-pentanone/2-pentanone mixture, a 4-methyl-2-pentanone/3-methyl-2-butanone mixture, a 4-methyl-2-pentanone/3-pentanone mixture, a 4-methyl-2-pentanone/2-hexanone mixture, a 4-methyl-2-pentanone/3-hexanone mixture, a 4-methyl-2-pentanone/2-methyl-3-pentanone mixture, a 4-methyl-2-pentanone/3-methyl-2-pentanone mixture, etc.

In the case where the above developer is a mixture of two or more of ketones, or ketone(s) and alcohol, the proportion of 2-butanone, 2-methyl-3-butanone, 2-pentanone, 3-pentanone or 4-methyl-2-pentanone in said mixture should be generally determined within the range of from 20 to less than 100% by weight. More particularly, 2-butanone should be contained therein in an amount of from 5 to 40% by weight, preferably from 5 to 30% by weight; 2-methyl-3-butanone from 20 to 70% by weight, preferably from 20 to 50% by weight; 2-pentanone or 3-pentanone from 20 to less than 100% by weight, preferably 25 to less than 100% by weight; and 4-methyl-2-pentanone from 40 to less than 100% by weight, preferably from 60 to less than 100% by weight.

The alcohol which may be used in the developer is preferably 2-propanol, and should be contained therein in an amount of from more than 0 to 60% by weight, preferably from more than 0 to 30% by weight.

The invention will be described in more detail by way of the following Examples:

EXAMPLE 1

Poly(trifluoroethyl-α-chloroacrylate) (molecular weight 600,000) was coated by spin coating on a Cr masked substrate in a thickness of $0.5\mu$, and then subjected to prebaking treatment in the air at 200° C. for one hour. Subsequently, electron beams of an acceleration voltage of 20 KV were irradiated to a desired portion of the prebaked resist film at a rate of 3.5 $\mu C/cm^2$. Development treatment was thereafter carried out by a spray development with use of a 2-butanone/2-methyl-3-butanone mixture as the developer of this invention. At the same time, as a comparative example, development treatment was carried out by a dip development with use of the conventional developer. The respective developing times were observed and are shown in Table 1.

TABLE 1

| Developer | | Ratios of components (wt. %) | Developing times (sec.) |
|---|---|---|---|
| Comparative Example | 4-methyl-2-pentanone/2-propanol | 25:75 | 900 |
| Developer 1 | 2-butanone/2-methyl-3-butanone | 9:91 | 170 |
| Developer 2 | 2-butanone/2-methyl-3-butanone | 17:83 | 120 |
| Developer 3 | 2-butanone/2-methyl-3-butanone | 23:77 | 105 |
| Developer 4 | 2-butanone/2-methyl-3-butanone | 29:71 | 90 |
| Developer 5 | 2-butanone/2-methyl-3-butanone | 33:67 | 60 |

As is apparent from Table 1, with use of the developers of this invention, the developing time was shortened to 1/5 to 1/10 as compared with the case where the conventional developer was used. It was further confirmed that clear resist patterns having much less defects were obtained as the spray development process was employable.

EXAMPLE 2

In the same manner as in Example 1 except that, as the resist, a trifluoroethyl-α-chloroacrylate/methylmethacrylate copolymer (Copolymerization ratio of 97:3, molecular weight of 700,000) was used, a resist pattern was formed on a Cr masked substrate, and after electron beams were irradiated to a desired portion, development treatment was carried out by a spray development with use of a 2-butanone/2-methyl-3-butanone/2-propanol mixture as the developer of this invention. At the same time, as a comparative example, development treatment was carried out by dip development with use of the conventional developer. The respective developing times were observed and are shown in Table 2.

TABLE 2

| Developer | | Ratios of components (wt. %) | Developing times (sec.) |
|---|---|---|---|
| Comparative Example | 4-methyl-2-pentanone/2-propanol | 25:15 | 840 |
| Developer 1 | 2-butanone/2-methyl-3-butanone/2-propanol | 10:88:2 | 120 |
| Developer 2 | 2-butanone/2-methyl-3-butanone/2-propanol | 18:80:2 | 110 |
| Developer 3 | 2-butanone/2-methyl-3-butanone/2-propanol | 25:71:4 | 95 |
| Developer 4 | 2-butanone/2-methyl-3-butanone/2-propanol | 30:69:1 | 70 |

As is apparent from Table 2, it was confirmed as was the case in Example 1 that, with use of the developer of this invention, the developing time was shortened to 1/5 to 1/10 as compared with the conventional case, and resist patterns having much less defects were obtained.

EXAMPLE 3

Poly(trifluoroethyl-α-chloroacrylate) (molecular weight 600,000) was coated by spin coating on a Cr masked substrate in a thickness of $0.5\mu$, and then subjected to prebaking treatment in the air at 200° C. for one hour. Subsequently, electron beams of an accelaration voltage of 20 KV were irradiated to a desired portion of the prebaked resist film at a rate of 4 $\mu C/cm^2$. Development treatment was thereafter carried out by a spray development with use of 3-pentanone or a 3-pentanone/2-methyl-5-hexanone mixture as the developer of this invention. At the same time, as a comparative example, development treatment was carried out by a dip development with use of the conventional developer. The respective developing times were observed and are shown in Table 3.

TABLE 3

| Developer | | Ratios of components (wt. %) | Developing times (sec.) |
|---|---|---|---|
| Comparative Example | 4-methyl-2-pentanone/2-propanol | 25:75 | 850 |

TABLE 3-continued

| Developer | Developer | Ratios of components (wt. %) | Developing times (sec.) |
|---|---|---|---|
| Developer 1 | 3-pentanone/2-methyl-5-hexanone | 25:75 | 270 |
| Developer 2 | 3-pentanone/2-methyl-5-hexanone | 40:60 | 210 |
| Developer 3 | 3-pentanone/2-methyl-5-hexanone | 60:40 | 160 |
| Developer 4 | 3-pentanone/2-methyl-5-hexanone | 80:20 | 120 |
| Developer 5 | 3-pentanone/2-methyl-5-hexanone | 90:10 | 90 |
| Developer 6 | 3-pentanone/2-methyl-5-hexanone | 100:0 | 70 |

As is apparent from Table 3, with use of the developers of this invention, the developing time was shortened to 1/3 to 1/10 as compared with the case where the conventional developer was used. It was further confirmed that clear resist patterns having much less defects were obtained as the spray development process was employable.

EXAMPLE 4

Poly(trifluoroethyl-α-chloroacrylate) (molecular weight 800,000) was coated by spin coating on a Cr masked substrate in a thickness of 0.5μ, and then subjected to prebaking treatment in the air at 200° C. for one hour. Subsequently, electron beams of an accelaration voltage of 20 KV were irradiated to a desired portion of the prebaked resist film at a rate of 4.0 μC/cm². Development treatment was thereafter carried out by a spray development with use of 4-methyl-2-pentanone or a 4-methyl-2-pentanone/2-butanone mixture as the developer of this invention. At the same time, as a comparative example, development treatment was carried out by a dip development with use of the conventional developer. The respective developing times were observed and are shown in Table 4.

TABLE 4

| Developer | Developer | Ratios of components (wt. %) | Developing times (sec.) |
|---|---|---|---|
| Comparative Example | 4-methyl-2-pentanone/2-propanol | 70:30 | 1000 |
| Developer 1 | 4-methyl-2-pentanone/2-butanone | 100:0 | 240 |
| Developer 2 | 4-methyl-2-pentanone/2-butanone | 95:5 | 180 |
| Developer 3 | 4-methyl-2-pentanone/2-butanone | 90:10 | 170 |
| Developer 4 | 4-methyl-2-pentanone/2-butanone | 80:20 | 110 |
| Developer 5 | 4-methyl-2-pentanone/2-butanone | 70:30 | 80 |
| Developer 6 | 4-methyl-2-pentanone/2-butanone | 60:40 | 45 |

As is apparent from Table 4, with use of the developers of this invention, the developing time was shortened to 1/5 to 1/20 as compared with the case where the conventional developer was used. It was further confirmed that clear resist patterns having much less defects were obtained as the spray development process was employable.

EXAMPLE 5

In the same manner as in Example 1 except that, as the resist, a trifluoroethyl-α-chloroacrylate/methylmethacrylate copolymer (Copolymerization ratio of 97:3, molecular weight of 900,000) was used, a resist pattern was formed on a Cr masked substrate, and after electron beams were irradiated to a desired portion, development treatment was carried out by a spray development with use of 4-methyl-2-pentanone or a 4-methyl-2-pentanone/2-butanone mixture as the developer of this invention. At the same time, as a comparative example, development treatment was carried out by dip development with use of the conventional developer. The respective developing times were observed and are shown in Table 5.

TABLE 5

| Developer | Developer | Ratios of components (wt. %) | Developing times (sec.) |
|---|---|---|---|
| Comparative Example | 4-methyl-2-pentanone/2-propanol | 70:30 | 1200 |
| Developer 1 | 4-methyl-2-pentanone/2-butanone | 100:0 | 300 |
| Developer 2 | 4-methyl-2-pentanone/2-butanone | 95:5 | 220 |
| Developer 3 | 4-methyl-2-pentanone/2-butanone | 90:10 | 205 |
| Developer 4 | 4-methyl-2-pentanone/2-butanone | 80:20 | 142 |
| Developer 5 | 4-methyl-2-pentanone/2-butanone | 70:30 | 95 |
| Developer 6 | 4-methyl-2-pentanone/2-butanone | 60:40 | 56 |

As is apparent from Table 5, it was confirmed that, with use of the developer of this invention, the developing time was shortened to 1/4 to 1/20 as compared with the conventional case, and resist patterns having much less defects were obtained.

EXAMPLE 6

A trifluoroethyl-α-chloroacrylate/methacrylic acid copolymer (Copolymerization ratio of 94:6, molecular weight 560,000) was coated by spin coating on a Cr masked substrate in a thickness of 0.5μ, and then subjected to prebaking treatment in the air at 200° C. for one hour. Subsequently, electron beams of an accelaration voltage of 20 KV were irradiated to a desired portion of the prebaked resist film at a rate of 4.0 μC/cm². Development treatment was thereafter carried out by a spray development with use of 4-methyl-2-pentanone or a 4-methyl-2-pentanone/2-butanone mixture as the developer of this invention. At the same time, as a comparative example, development treatment was carried out by a dip development with us of the conventional developer. The respective developing times were observed and are shown in Table 6.

TABLE 6

| Developer | | Ratios of components (wt. %) | Developing times (sec.) |
|---|---|---|---|
| Comparative Example | 4-methyl-2-pentanone/2-propanol | 75:25 | 890 |
| Developer 1 | 4-methyl-2-pentanone/2-butanone | 100:0 | 260 |
| Developer 2 | 4-methyl-2-pentanone/2-butanone | 95:5 | 190 |
| Developer 3 | 4-methyl-2-pentanone/2-butanone | 90:10 | 180 |
| Developer 4 | 4-methyl-2-pentanone/2-butanone | 80:20 | 119 |
| Developer 5 | 4-methyl-2-pentanone/2-butanone | 70:30 | 85 |
| Developer 6 | 4-methyl-2-pentanone/2-butanone | 60:40 | 48 |

As is apparent from Table 6, with use of the developers of this invention, the developing time was shortened to 1/5 to 1/20 as compared with the case where the conventional developer was used. It was further confirmed that clear resist patterns having much less defects were obtained as the spray development process was employable.

As also apparent from the above Examples, it is possible to select desired developing time by adjusting optionally the composition of the developer.

As described hereinabove in detail, with use of the developer according to this invention, it is possible to substantially shorten the developing time and accordingly to employ the spray development process, whereby clear resist pattern having much less defects can be formed in a much shorter period of time than the conventional case, and thus, it is possible to present a process for forming a resist pattern, which can be effectively used for fine processing of semiconductor substrate, masked substrate, etc., and which is quite suitable for mass production.

We claim:

1. In a process for forming resist patterns by coating on a substrate at least one selected from homopolymers of a monomer represented by the formula:

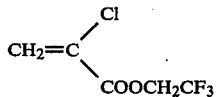

and copolymers of said monomer with other vinyl monomers, applying radiation to a desired portion thereof, and thereafter carrying out development treatment with use of a developer not containing alcohol; the improvement wherein said alcohol-less developer is composed of one or more of ketones selected from the group consisting of 2-butanone, 2-methyl-3-butanone, 2-pentanone, 3-pentanone and 4-methyl-2-pentanone; or a mixture thereof with another ketone, except for a single use of 2-butanone.

2. The process according to claim 1, wherein said other ketone is selected from the group consisting of 2-heptanone, 3-heptanone, 2-hexanone, 3-hexanone, 2-methyl-5-hexanone, 3-methyl-5-hexanone, 4-methyl-5-hexanone, 3-methyl-2-butanone, 2-methyl-3-pentanone and 3-methyl-2-pentanone.

3. The process according to claim 1, wherein the content of 2-butanone, 2-methyl-3-butanone, 2-pentanone, 3-pentanone or 4-methyl-2-pentanone in the developer ranges from 20 to less than 100% by weight.

4. The process according to claim 3, wherein said 2-butanone is contained in the developer in an amount of from 5 to 40% by weight.

5. The process according to claim 3, wherein said 2-methyl-3-butanone is contained in the developer in an amount of from 20 to 70% by weight.

6. The process according to claim 3, wherein said 2-pentanone or 3-pentanone is contained in the developer in an amount of from 20 to less than 100% by weight.

7. The process according to claim 3, wherein said 4-methyl-2-pentanone is contained in the developer in an amount of from 40 to less than 100% by weight.

8. The process according to claim 1, wherein said developer consists essentially of a 2-butanone/2-methyl-3-butanone mixture.

9. The process according to claim 1, wherein said developer consists essentially of a 3-pentanone/2-methyl-5-hexanone mixture.

10. The process according to claim 1, wherein said developer consists essentially of a 4-methyl-2-pentanone/2-butanone mixture.

11. The process according to claim 1, wherein said developer consists essentially of 4-methyl-2-pentanone.

12. The process according to claim 1, wherein said developer consists essentially of a 2-pentanone/2-heptanone mixture.

13. The process according to claim 1, wherein said developer consists essentially of a 2-pentanone/2-methyl-5-hexanone mixture.

14. The process according to claim 1, wherein said developer consists essentially of a 2-pentanone/3-methyl-5-hexanone mixture.

15. The process according to claim 1, wherein said developer consists essentially of a 2-pentanone/4-methyl-5-hexanone mixture.

16. The process according to claim 1, wherein said developer consists essentially of a 3-pentanone/3-heptanone mixture.

17. The process according to claim 1, wherein said developer consists essentially of a 3-pentanone/3-methyl-5-hexanone mixture.

18. The process according to claim 1, wherein said developer consists essentially of a 3-pentanone/4-methyl-5-hexanone mixture.

19. In a process for forming resist patterns by coating on a substrate at least one selected from homopolymers of monomer represented by the formula:

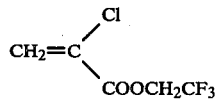

and copolymers of said monomer with other vinyl monomers, applying radiation to a desired portion thereof, and thereafter carrying out development treatment with use of a developer, the improvement wherein said developer is composed of a 2-butanone/2-methyl-3-butanone/2-propanol mixture containing 2-propanol in an amount of from 1 to 4% by weight.

* * * * *